(12) United States Patent
Kang et al.

(10) Patent No.: US 8,559,245 B2
(45) Date of Patent: Oct. 15, 2013

(54) INTERNAL VOLTAGE GENERATING CIRCUIT HAVING SELECTIVELY DRIVEN DRIVERS IN SEMICONDUCTOR MEMORY APPARATUS

(75) Inventors: Khil-Ohk Kang, Ichon (KR); Kyung-Whan Kim, Ichon (KR)

(73) Assignee: SK hynix Inc. (KR)

( * ) Notice: Subject to any disclaimer, the term of this patent is extended or adjusted under 35 U.S.C. 154(b) by 587 days.

(21) Appl. No.: 12/331,289

(22) Filed: Dec. 9, 2008

(65) Prior Publication Data
US 2009/0231930 A1 Sep. 17, 2009

(30) Foreign Application Priority Data

Mar. 11, 2008 (KR) .................. 10-2008-0022634

(51) Int. Cl.
*G11C 7/12* (2006.01)
*G11C 8/08* (2006.01)

(52) U.S. Cl.
USPC ............. 365/189.09; 365/189.07; 365/189.11

(58) Field of Classification Search
USPC ..................... 365/189.07, 189.09, 189.11
See application file for complete search history.

(56) References Cited

U.S. PATENT DOCUMENTS

| | | | | |
|---|---|---|---|---|
| 5,249,155 | A * | 9/1993 | Arimoto et al. | 365/222 |
| RE36,932 | E * | 10/2000 | Furutani | 365/226 |
| 6,201,378 | B1 * | 3/2001 | Eto et al. | 323/313 |
| 6,661,279 | B2 * | 12/2003 | Yabe | 327/546 |
| 6,958,947 | B2 | 10/2005 | Park et al. | |
| 7,212,046 | B2 * | 5/2007 | Hur | 327/143 |
| 7,382,677 | B2 | 6/2008 | Lee et al. | |
| 7,605,643 | B2 * | 10/2009 | Kuriyama | 327/540 |
| 2007/0280008 | A1 | 12/2007 | Byeon | |
| 2008/0001581 | A1 | 1/2008 | Takeda et al. | |
| 2008/0116862 | A1 * | 5/2008 | Yang et al. | 323/269 |

FOREIGN PATENT DOCUMENTS

| | | |
|---|---|---|
| KR | 1019980071820 | 10/1998 |
| KR | 1020050052891 | 6/2005 |
| KR | 1020060031027 | 4/2006 |

* cited by examiner

*Primary Examiner* — J. H. Hur
(74) *Attorney, Agent, or Firm* — Baker & McKenzie LLP

(57) ABSTRACT

An internal voltage generating circuit of a semiconductor memory apparatus includes a first voltage generating unit to output a first output voltage to a common node, the first output voltage is generated in response to a first reference voltage, and a second voltage generating unit to output a second output voltage to the common node, the second output voltage is generated in response to a second reference voltage.

5 Claims, 6 Drawing Sheets

INTERNAL VOLTAGE GENERATING CIRCUIT HAVING SELECTIVELY DRIVEN DRIVERS IN SEMICONDUCTOR MEMORY APPARATUS

CROSS-REFERENCES TO RELATED APPLICATION

The present application claims priority to Korean application number 10-2008-0022634, filed on Mar. 11, 2008, in the Korean Intellectual Property Office, which is incorporated herein by reference in its entirety as set forth in full.

BACKGROUND

1. Technical Field

The embodiments described herein relate to a semiconductor memory apparatus and, more particularly, to an internal voltage generating circuit of a semiconductor memory apparatus.

2. Related Art

In general, a dynamic random access memory (DRAM) device can write data into a memory cell having one transistor and one capacitor, and can read the data from the memory cell. Since the DRAM device employs an NMOS transistor as the memory cell transistor, the DRAM device has a pumping circuit for driving word lines and for generating a pumping voltage, which is higher than an external power supply voltage VDD, in consideration of the voltage loss of a threshold voltage (Vt) of the memory cell transistor.

For example, in order to drive the NMOS transistor, a high voltage, which is higher than a drain voltage by the threshold voltage, has to be applied to a gate of the NMOS transistor. Commonly, since the maximum voltage that is supplied to the DRAM device, i.e., the drain of the NMOS transistor, is the power supply voltage VDD, a boosted voltage of VDD+Vt has to be supplied to the gate of the NMOS transistor in order to ensure that a complete VDD level is read out from the memory cell or a bit line, or written into the memory cell or the bit line.

Various methods for reducing power consumption in the semiconductor memory apparatus include reducing current consumption in a self refresh mode of the DRAM device. A self refresh current is taken by measuring a current that is consumed to store data in the memory cell during the self refresh time period. It is necessary to increase the time period of the self refresh in order to reduce the self refresh current. In order to increase the time period of the self refresh, it is required to increase the data retention time in which the data is maintained within the memory cell. For example, one method includes increasing the data retention time by increasing a back-bias voltage VBB that is supplied to the transistor in the memory cell. Here, the back-bias voltage VBB, which is generated by a voltage pumping circuit, is made in a relative high voltage level in the self refresh mode so that the off-leakage current is reduced and the data retention time is increased.

As a result, the high voltage VPP is used for driving the word lines of the DRAM device and the back-bias voltage VBB is supplied to an area in which the cell transistor of the memory cell is formed in order to reduce the self refresh current. The high voltage VPP and the back-bias voltage VBB are generated by an internal voltage generating circuit.

FIG. 1 is a schematic circuit diagram of a conventional internal voltage generating circuit of a semiconductor memory apparatus. In FIG. 1, an internal voltage generating circuit includes a comparison unit 10, a driver 20, and a voltage dividing unit 30.

The comparison unit 10 compares a reference voltage Vref with a division voltage V_dv, and then generates a detection signal 'det'. The driver 20 drives an external power supply voltage VDD according to the detection signal 'det', and then outputs an internal voltage V_int. Here, the driver 20 can be made up of a transistor P1.

The voltage dividing unit 30 generates the division voltage V_dv by dividing the internal voltage V_int. The voltage dividing unit 30 includes first and second resistors R1 and R2 that are connected in series to each other. The first and second resistors R1 and R2 are disposed between an output terminal and a ground voltage terminal (VSS). Accordingly, the division voltage V_dv is output at a connection node between the first and second resistors R1 and R2.

During operation, the external power supply voltage is continuously being reduced to implement a low power semiconductor memory apparatus. However, when the external power supply voltage VDD is reduced, the driver 20, which drives the external power supply voltage VDD, outputs a relatively low current so that a low current flows into the circuits to which the internal voltage V_int is supplied. As a result, a malfunction can be caused within the internal circuits of the semiconductor memory apparatus Meanwhile, if the size of the driver 20 is enlarged to increase an amount of current in the driver 20, the internal voltage V_int can be increased in proportion to the increased size of the driver 20. Accordingly, a malfunction can be also caused within the internal circuits of the semiconductor memory apparatus because the internal voltage V_int, which is higher than a target voltage level, is applied to the internal circuits.

SUMMARY

An internal voltage generating circuit capable of supplying a sufficient amount of current in a semiconductor memory apparatus is described herein.

In one aspect, an internal voltage generating circuit of a semiconductor memory apparatus includes a first voltage generating unit to output a first output voltage to a common node, the first output voltage is generated in response to a first reference voltage, and a second voltage generating unit to output a second output voltage to the common node, the second output voltage is generated in response to a second reference voltage.

In another aspect, an internal voltage generating circuit of a semiconductor memory apparatus includes a plurality of drivers for driving an internal voltage by driving an external power supply voltage, and a driver control unit for controlling a number of the plurality of drivers to perform driving operation according to a level of the internal voltage, wherein the internal voltage is output at a common node to which output terminals of the plurality of drivers are connected.

In another aspect, an internal voltage generating circuit of a semiconductor memory apparatus includes a comparison unit for generating a detection signal by comparing a first reference voltage with an internal voltage, a first driver for driving an external power supply voltage in response to the detection signal, a control unit for generating a control signal by comparing a second reference voltage with the internal voltage, and a control driver for driving the external power supply voltage in response to the control signal and the detection signal, wherein the internal voltage is output at a common node to which output terminals of the first and control drivers are connected.

In another aspect, an internal voltage generating circuit of a semiconductor memory apparatus includes a first driver for performing a driving operation in response to a first detection signal, a second driver for performing a driving operation in response to a second detection signal, a first comparison unit for generating the first detection signal by comparing a reference voltage with a first division voltage, a second comparison unit for generating the second detection signal by comparing the reference voltage with a second division voltage, wherein an internal voltage is generated at a common node to which output terminals of the first and second drivers are connected, and a voltage dividing unit for generating the first and second division voltages by dividing the internal voltage, wherein the first division voltage is higher than the second division voltage.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
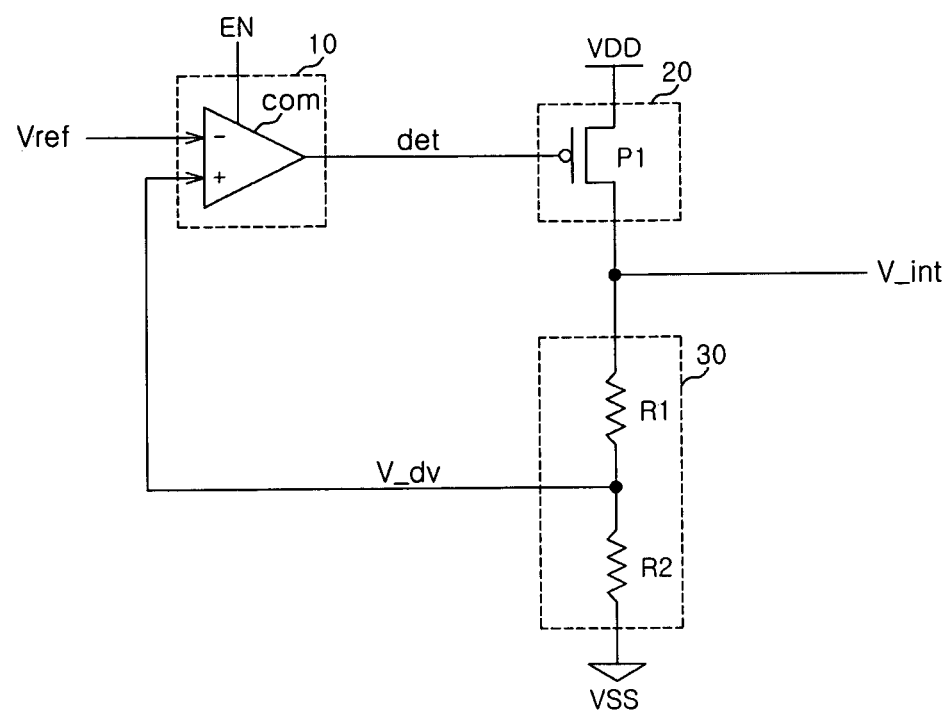
FIG. 1 is a schematic circuit diagram of a conventional internal voltage generating circuit of a semiconductor memory apparatus.
Figure 2:
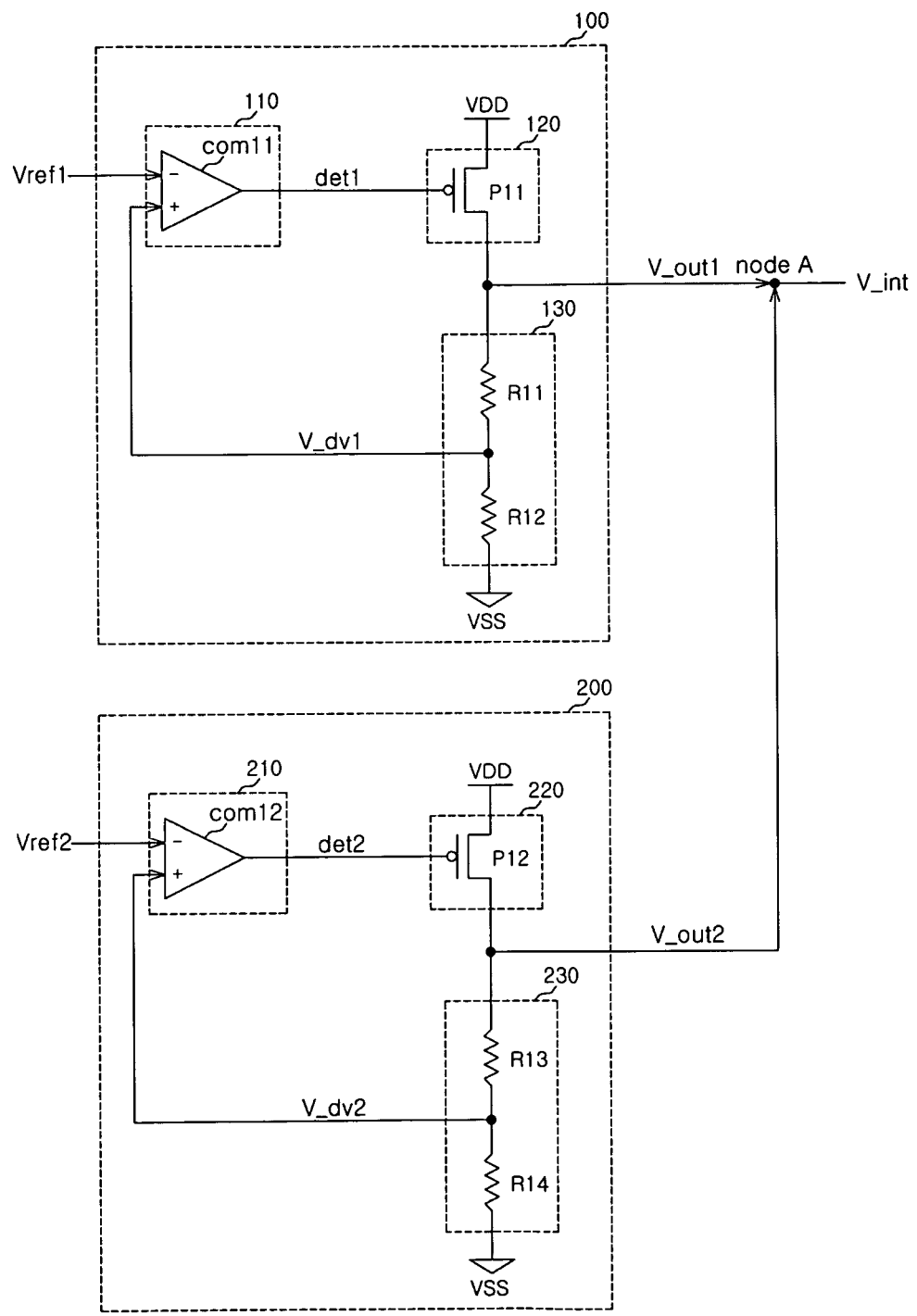
FIG. 2 is a schematic circuit diagram of an exemplary internal voltage generating circuit capable of being implemented in a semiconductor memory apparatus according to one embodiment.

FIG. 2 is a schematic circuit diagram of an exemplary internal voltage generating circuit capable of being implemented in a semiconductor memory apparatus according to one embodiment. In FIG. 2, an internal voltage generating circuit can be configured to include a first voltage generating unit 100 and a second voltage generating unit 200.

The first voltage generating unit 100 can be configured to generate a first output voltage V_out1 in response to a level of a first reference voltage Vref1. In addition, the first voltage generating unit 100 can compare the first reference voltage Vref1 with the first output voltage V_out1 to generate the first output voltage V_out1 having a relatively constant voltage level. Here, the first voltage generating unit 100 can include a first comparison unit 110, a first driver 120, and a first voltage dividing unit 130.

The first comparison unit 110 is configured to generate a first detection signal 'det1' by comparing the first reference voltage Vref1 with a first division voltage V_dv1 that is an output signal of the first voltage dividing unit 130. In addition, the first comparison unit 110 can be considered a first comparator com11. For example, the first comparator com11 can generate a first detection signal 'det1' at a low level when the first division voltage V_dv1 is lower than the first reference voltage Vref1. Conversely, the first comparator com11 can generate the first detection signal 'det1' at a high level when the first division voltage V_dv1 is higher than the first reference voltage Vref1.

The first driver 120 can output the first output voltage V_out1 by driving an external power supply voltage VDD according to the voltage level of the first detection signal det1. Here, the first driver 120 can be a first transistor P11. The first transistor P11 can include a gate terminal to which the first detection signal 'det1' can be supplied, a source terminal to which the external power supply voltage VDD can be supplied, and a drain terminal that can be used as an output terminal of the first driver 120 to output the first output voltage V_out1.

The first voltage dividing unit 130 can be configured to generate the first division voltage V_dv1 by dividing the first output voltage V_out1. Here, the first voltage dividing unit 130 can include first and second resistors R11 and R12 that are connected in series to each other. The first and second resistors R11 and R12 can be disposed between an output terminal of the first driver 120 and a ground voltage terminal (VSS). Accordingly, the first division voltage V_dv1 can be output at a connection node between the first and second resistors R11 and R12.

The second voltage generating unit 200 can be configured to generate a second output voltage V_out2 in response to a voltage level of a second reference voltage Vref2. For example, the second voltage generating unit 200 can be configured to compare the second reference voltage Vref2 with the second output voltage V_out2 to generate the second output voltage V_out2 having a substantially constant voltage level. In addition, the voltage level of the first reference voltage Vref1 can be higher than the voltage level of the second reference voltage Vref2.

The second voltage generating unit 200 can include a second comparison unit 210, a second driver 220, and a second voltage dividing unit 230. The second comparison unit 210 can be configured to generate a second detection signal 'det2' by comparing the second reference voltage Vref2 with a second division voltage V_dv2 that is an output signal of the second voltage dividing unit 230.

The second comparison unit 210 can be considered a second comparator com12. For example, the second comparator com12 can generate the second detection signal 'det2', which can be activated at a low level, when the second division voltage V_dv2 is lower than the second reference voltage Vref2. Conversely, the second comparator com12 can generate the second detection signal 'det2' at a high level when the second division voltage V_dv2 is higher than the second reference voltage Vref2.

The second driver 220 can output the second output voltage V_out2 by driving an external power supply voltage VDD according to the voltage level of the second detection signal 'det2'. Here, the second driver 220 can be a second transistor P12. The second transistor P12 can have a gate terminal to which the second detection signal 'det2' can be supplied, a source terminal to which the external power supply voltage VDD can be supplied, and a drain terminal that can be used as an output terminal of the second driver 220 to output the second output voltage V_out2.

The second voltage dividing unit 230 can generate the second division voltage V_dv2 by dividing the second output voltage V_out2. Here, the second voltage dividing unit 230 can include third and fourth resistors R13 and R14 that can be connected in series to each other. The third and fourth resistors R13 and R14 can be disposed between an output terminal of the second driver 220 and the ground voltage terminal (VSS). Accordingly, the second division voltage V_dv2 can be output at a connection node between the third and fourth resistors R13 and R14.

An exemplary operation of the internal voltage generating circuit will be described in detail with reference to FIG. 2.

First, as mentioned above, it can be presumed that the first reference voltage Vref1 is higher than the second reference voltage Vref2. The first and second voltage dividing units 130 and 230 respectively output the first and second division voltages V_dv1 and V_dv2 each of which has a one-half level of the supply power voltage.

For example, when the first reference voltage Vref1 is about 4V, the second reference voltage Vref2 can be about 2V, the internal voltage V_int can be in the ground voltage level VSS, and the first and second division voltages V_dv1 and V_dv2 can be in the ground voltage level VSS. Since the first division voltage V_dv1 can be lower than the first reference voltage Vref1, the first detection signal 'det1' can be activated at a low level. Since the second division voltage V_dv2 can be lower than the second reference voltage Vref2, the second detection signal 'det2' can also be activated at a low level. Accordingly, the first and second drivers 120 and 220 can receive the first and second detection signals 'det1' and 'det2', which are activated at a low level, and then can generate the first and second output voltages V_out1 and V_out2, respectively.

The first and second output voltages V_out1 and V_out2 can be output as the internal voltage V_int through a common node (node A). Here, the level of the internal voltage V_int can be increased. As the internal voltage V_int is increased, the first and second division voltages also can be increased in the voltage level.

When the second division voltage V_dv2 is over about 2V, the second detection signal 'det2' can be inactivated at a high level. Accordingly, the second driver 220 does not carry out the driving operation. As a result, the output of the first driver 20, i.e., the first output voltage V_out1, can be output as the internal voltage V_int.

When the first division voltage V_dv1 is over about 4V, the first detection signal 'det1' can be inactivated at a high level. Accordingly, the first driver 120 does not carry out the driving operation Finally, the internal voltage generating circuit can produce the internal voltage by using one driver or a plurality of drivers based on the voltage level of the internal voltage. If the level of the internal voltage is lower than a predetermined voltage level because the internal circuits using the internal voltage consumes large amounts of current, then the plurality of drives can perform the driving operation to supply a large amount of current to the internal circuits. Meanwhile, if the level of the internal voltage does not drop to a predetermined voltage level because the internal circuits do not consume large amounts of current, then only one driver, instead of the plurality of drivers, can perform the driving operation to supply a small amount of current to the internal circuits. Furthermore, in the case where the level of the external power supply voltage is reduced and the level of the internal voltage is then reduced, the amount of current of the internal voltage can be improved by using the plurality of drivers. Thus, a stable current can be supplied to the semiconductor memory apparatus.

Figure 3:
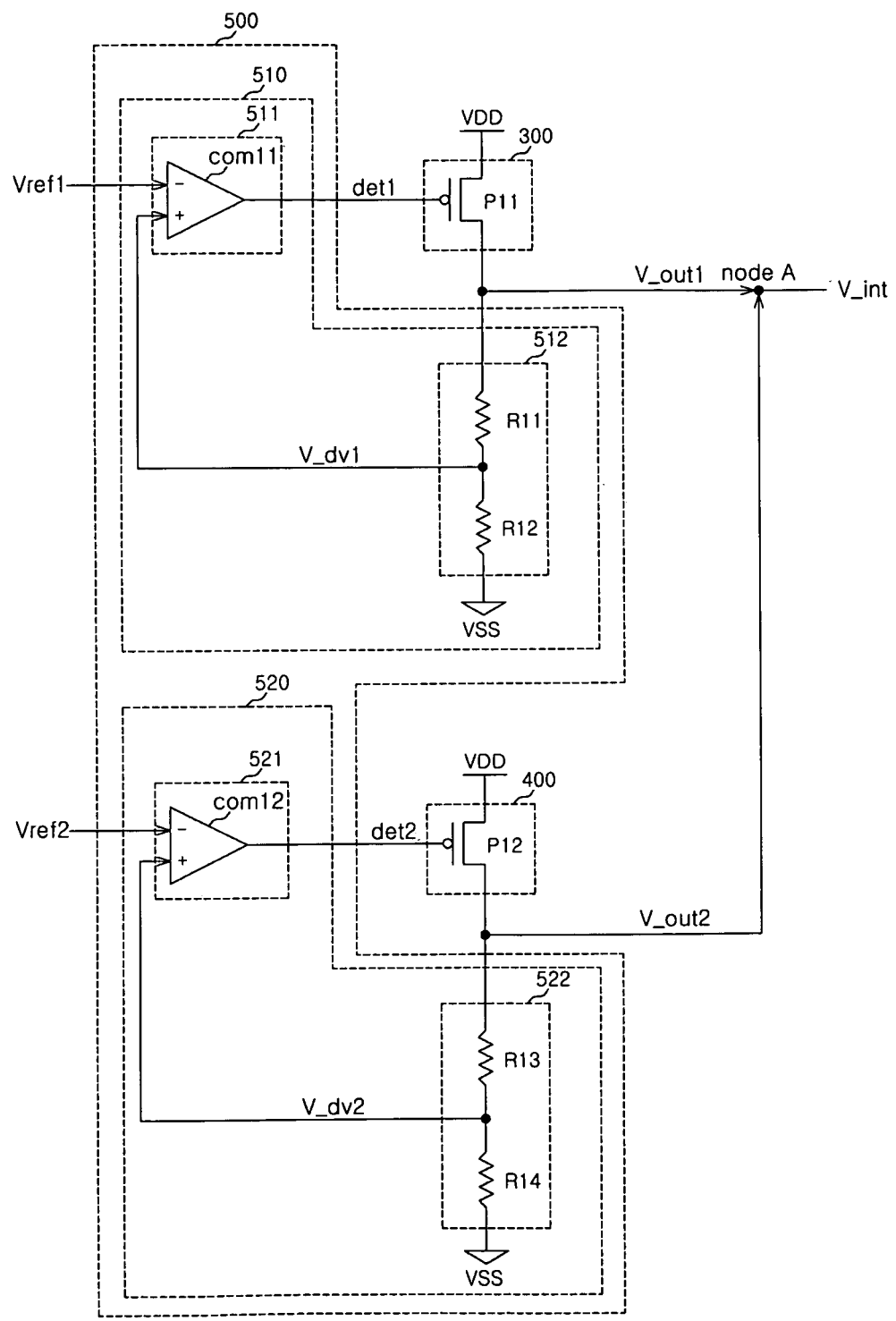
FIG. 3 is a schematic circuit diagram of another exemplary internal voltage generating circuit capable of being implemented in a semiconductor memory apparatus according to another embodiment.

FIG. 3 is a schematic circuit diagram of another exemplary internal voltage generating circuit capable of being implemented in a semiconductor memory apparatus according to another embodiment. In FIG. 3, the internal voltage generating circuit can be configured to include a first driver 300, a second driver 400, and a driver control unit 500 to control driving operations of the first and second drivers 300 and 400.

The first driver 300 can be configured to output a first output voltage V_out1 by driving an external power supply voltage VDD in response to a first detection signal det1. The second driver 400 can be configured to output a second output voltage V_out2 by driving the external power supply voltage VDD in response to a second detection signal det2. Here, the first and second output voltages V_out1 and V_out2 can be output as an internal voltage V_int through a common node (node A).

The driver control unit 500 can include a first control unit 510 and a second control unit 520. The first control unit 510 can be configured to generate the first detection signal 'det1' by comparing a first reference voltage Vref1 with the first output voltage V_out1. For example, the first control unit 510 can include a first comparator 511 and a first voltage dividing unit 512.

The first comparator 511 can be configured to generate the first detection signal 'det1' by comparing the first reference voltage Vref1 with a first division voltage V_dv1 that can be an output signal of the first voltage dividing unit 512. The first voltage dividing unit 512 can be configured to generate the first division voltage V_dv1 by dividing the first output voltage V_out1.

The second control unit 520 can be configured to generate the second detection signal 'det2' by comparing a second reference voltage Vref2 with the second output voltage V_out2. For example, the second control unit 520 can include a second comparator 521 and a second voltage dividing unit 522.

The second comparator 521 can generate the second detection signal 'det2' by comparing the second reference voltage Vref2 with a second division voltage V_dv2 that can be an output signal of the second voltage dividing unit 522. The second voltage dividing unit 522 can be configured to generate the second division voltage V_dv2 by dividing the second output voltage V_out2.

The first comparison unit 511, the second comparison unit 521, the first voltage dividing unit 512, the second voltage dividing unit 522, the first driver 300 and the second driver 400 in the driving control unit 500 can have the same configuration as the first comparison unit 110, the second comparison unit 210, the first voltage dividing unit 130, a second voltage dividing unit 230, the first driver 120 and the second driver 220 (in FIG. 2), respectively.

An exemplary operation of the internal voltage generating circuit will be described in detail with reference to FIG. 3.

It can be presumed that the first reference voltage Vref1 can be about 4V, the second reference voltage Vref2 can be about 2V, and the first and second voltage dividing units 512 and 522 can respectively output the first and second division voltages V_dv1 and V_dv2, each of which can have a one-half level of the supply power voltage.

The first control unit 510 can output the first detection signal 'det1', which can be activated at a low level, when the first division voltage V_dv1 produced by dividing the first output voltage V_out1 is below about 4V. In addition, the second control unit 520 can output the second detection signal 'det2', which can be activated at a low level, when the second division voltage V_dv2 generated by dividing the second output voltage V_out2 is below about 2V. As a result, the first driver 300 can perform the driving operation when the internal voltage V_int is below about 8V and the second driver 400 can performs the driving operation when the internal voltage V_int is below about 4V. For example, when the internal voltage V_int is below about 4V, all the first and second drivers 300 and 400 can perform the driving operation and, when the internal voltage V_int is within a range of about 4V to about 8V, only the first driver 300 performs the driving operation. Conversely, when the internal voltage V_int is over about 8V, all the first and second drivers 300 and 400 do not perform the driving operation.

As detailed above, the internal voltage generating circuit can increase the level of the internal voltage V_int through a large number of drivers when the level of the internal voltage V_int is decreased below a predetermined level, i.e., below about 4V. In addition, when the internal voltage V_int is decreased below a predetermined level, i.e., about 4V to about 8V, the internal voltage V_int can be increased by a small number of drivers.

The internal voltage generating circuit according to another embodiment can supply large amounts of current to internal circuits by using a large member of drivers when the internal voltage is reduced below a predetermined voltage level due to a large amount of current consumed by the internal circuits, In addition, the internal voltage generating circuit can supply small amounts of current to internal circuits by using a small member of drivers when the internal voltage is reduced below a predetermined voltage level due to a small amount of current consumed by the internal circuits. Moreover, when the internal voltage is reduced below a predetermined voltage level due to the low level of the external power supply voltage, the plurality of drivers can be operated to increase the amount of current supplied to the internal circuits. Accordingly, sufficient amounts of current can be supplied to the internal circuits through the internal voltage generating circuit so that the semiconductor memory apparatus can perform stable operations.

Figure 4:
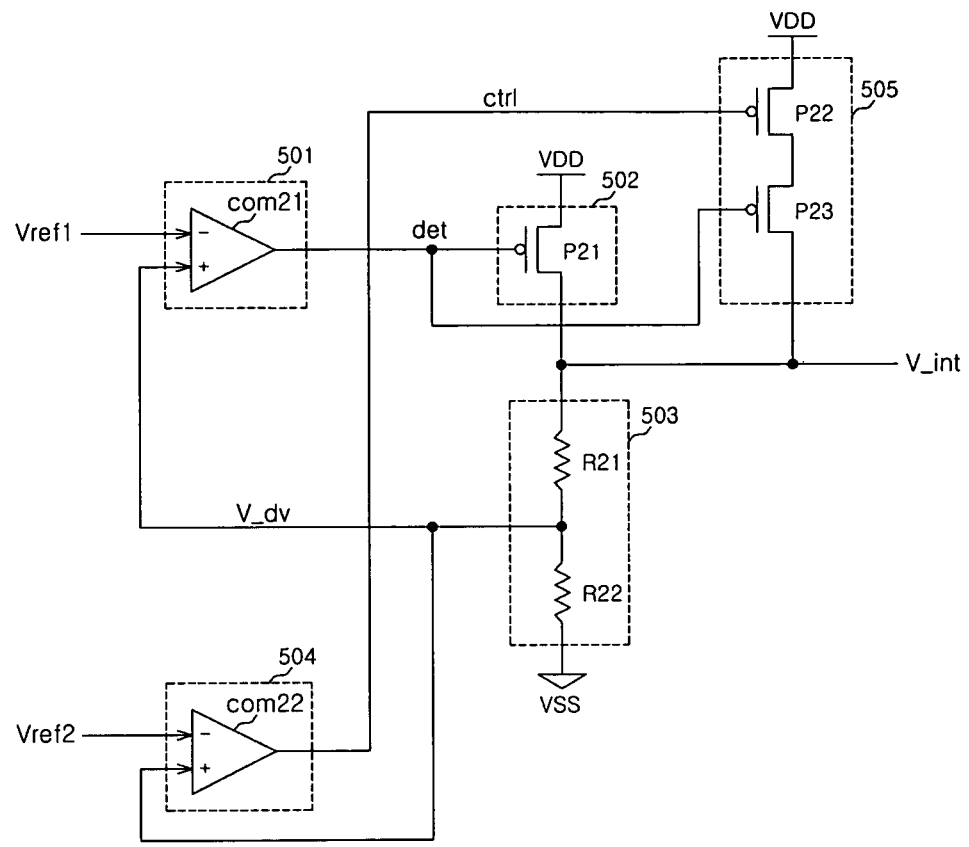
FIG. 4 is a schematic circuit diagram of another exemplary internal voltage generating circuit capable of being implemented in a semiconductor memory apparatus according to another embodiment.

FIG. 4 is a schematic circuit diagram of another exemplary internal voltage generating circuit capable of being implemented in a semiconductor memory apparatus according to another embodiment. In FIG. 4, an internal voltage generating circuit can be configured to include a comparison unit 501, a driver 502, a voltage dividing unit 503, a control unit 504, and a control driver 505.

The comparison unit 501 can include a first comparator com21. The first comparator com21 can generate a detection signal 'det' by comparing a first reference voltage Vref1 with a division voltage V_dv that can be an output signal of the voltage dividing unit 503.

The driver 502 can drive an external power supply voltage VDD in response to the voltage level of the detection signal 'det'. For example, the driver 502 can include a first transistor P21. The first transistor P21 can have a gate terminal to which the detection signal 'det' can be supplied, a source terminal to which the external power supply voltage VDD can be supplied, and a drain terminal to which an output terminal can be connected.

The voltage dividing unit 503 can generate the division voltage V_dv by dividing the internal voltage V_int. For example, the voltage dividing unit 503 can include first and second resistors R21 and R22 that are connected in series to each other. The first and second resistors R21 and R22 can be disposed between an output terminal of the driver 502 and a ground voltage terminal (VSS). Accordingly, the division voltage V_dv can output at a connection node between the first and second resistors R21 and R22.

The control unit 504 can generate a control signal 'ctrl' by comparing a second reference voltage Vref2 with the division voltage V_dv. The control unit 504 can include a second comparator com22, wherein the second comparator com22 can output the control signal 'ctrl' by comparing the second reference voltage Vref2 with the division voltage V_dv.

The control driver 505 can receive the external power supply voltage VDD when the control signal 'ctrl' is activated, and can drive the external power supply voltage VDD when the detection signal 'det' is activated. Here, the control driver 505 can include second and third transistors P22 and P23. The second transistor P22 can have a gate terminal to which the control signal 'ctrl' can be supplied, and a source terminal to which the external power supply voltage VDD can be applied. The transistor P23 can have a gate terminal to which the detection signal 'det' can be supplied, a source terminal to which a drain of the transistor P22 can be connected, and a drain terminal that can be used as an output terminal of the control driver 505. Accordingly, the internal voltage V_int can be output through a common node at which output terminals of the driver 502 and the control driver 505 are connected to each other.

An exemplary operation of the internal voltage generating circuit will be described in detail with reference to FIG. 4.

Presuming that a level of the first reference voltage Vref1 can be higher than a level of the second reference voltage Vref2, when the division voltage V_dv, which can be generate by dividing the internal voltage V_int, is lower than the second reference voltage Vref2, both the detection signal 'det' and the control signal 'ctrl' can be activated at a low level. Accordingly, the driver 502 and the control driver 505 can generate the internal voltage V_int by driving the external power supply voltage VDD When the division voltage V_dv is lower than the first reference voltage Vref1 and the division voltage V_dv is higher than the second reference voltage Vref2, the detection signal 'det' can be activated at a low level and the control signal 'ctrl' can be inactivated at a high level. Accordingly, only the driver 502 can drive the external power supply voltage VDD to generate the internal voltage V_int.

When the division voltage V_dv is higher than the first reference voltage Vref1, both the detection signal 'det' and the control signal 'ctrl' can be inactivated at a high level. Accordingly, driving operations are not carried out by the driver 502 and the control driver 505.

The internal voltage generating circuit can be configured to control the number of drivers to generate the internal voltage. For example, when the level of the internal voltage is lower than a predetermine voltage level, i.e., lower than the level of the second reference voltage Vref2, the number of drivers to perform the driving operation can be increased. Similarly, when the level of the internal voltage is higher than a predetermine voltage level, i.e., higher than the level of the second reference voltage Vref2, the number of drivers to perform the driving operation can be reduced. Accordingly, when the level of the external power supply voltage is low so that the level of the internal voltage is lower than a predetermine voltage level; the number of drivers to perform the driving operation can be increased. Similarly, when the level of the internal voltage is higher than a predetermine voltage level; the number of drivers to perform the driving operation can be reduced. Thus, a constant internal voltage can be generated, regardless of the level fluctuation of the external power supply voltage, with sufficient amounts of current.

Figure 5:
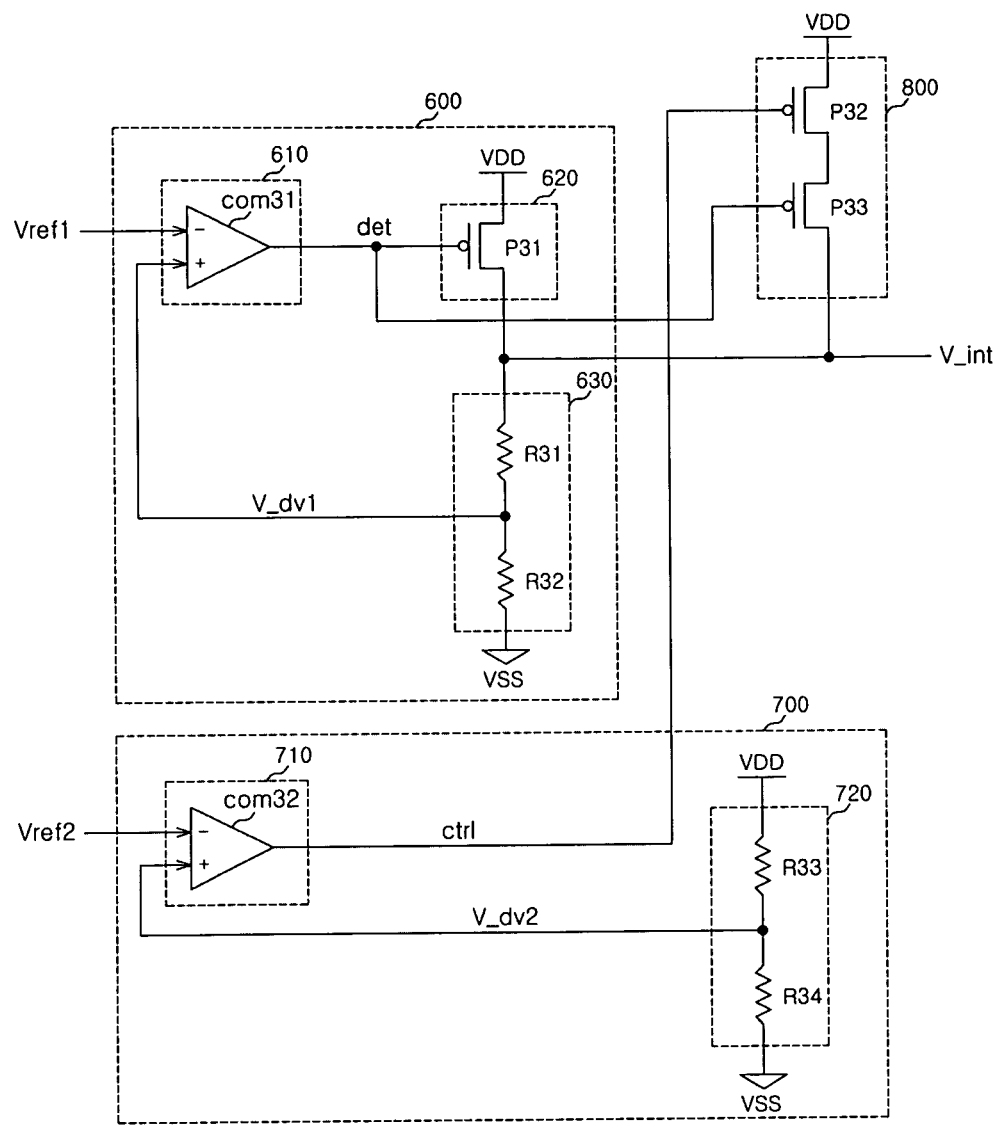
FIG. 5 is a schematic circuit diagram of another exemplary internal voltage generating circuit capable of being implemented in a semiconductor memory apparatus according to another embodiment.

FIG. 5 is a schematic circuit diagram of another exemplary internal voltage generating circuit capable of being implemented in a semiconductor memory apparatus according to another embodiment. In FIG. 5, an internal voltage generating circuit can be configured to include an internal voltage generating unit 600, a control unit 700, and a control driver 800.

The internal voltage generating unit 600 can generate a detection signal 'det' by comparing a first reference voltage Vref1 with a first division voltage V_dv1, and can output an internal voltage V_int by driving an external power supply voltage VDD in response to a detection signal 'det'. For example, the internal voltage generating unit 600 can include a first comparison unit 610, a driver 620, and a first voltage dividing unit 630.

The first comparison unit 610, which can function as a first comparator com31, can generate the detection signal 'det' by comparing the first reference voltage Vref1 with the first division voltage V_dv1 that is an output signal of the first voltage dividing unit 630.

The driver 620 can output the internal voltage V_int by driving the external power supply voltage VDD based on the voltage level of the detection signal 'det'. For example, the driver 620 can include a first transistor P31, wherein the first transistor P31 can have a gate terminal to which the detection signal 'det' can be supplied, a source terminal to which the external power supply voltage VDD can be supplied, and a drain terminal to which an output terminal of the driver 620 can be connected.

The first voltage dividing unit 630 can generate the first division voltage V_dv1 by dividing the internal voltage V_int. For example, the first voltage dividing unit 630 can include first and second resistors R31 and R32 that are connected in series to each other. The first and second resistors R331 and R32 can be disposed between the output terminal of the driver 620 and a ground voltage terminal (VSS). Accordingly, the first division voltage V_dv1 can be output at the connection node between the first and second resistors R31 and R32.

The control unit 700 can generate a control signal 'ctrl' by comparing a second reference voltage Vref2 with the external power supply voltage VDD. For example, the control unit 700 can include a second comparison unit 710 and a second voltage dividing unit 720.

The comparison unit 710, which can function as a second comparator com32, can generate the control signal 'ctrl' by comparing the second reference voltage Vref2 with the second division voltage V_dv2.

The second voltage dividing unit 720 can generate the second division voltage V_dv2 by dividing the external power supply voltage VDD. For example, the second voltage dividing unit 720 can include third and fourth resistors R33 and R34 that are connected in series to each other between the external power supply voltage VDD and the ground voltage VSS supplied to the second voltage dividing unit 720. Accordingly, the second division voltage V_dv2 can be output at the connection node between the third and fourth resistors R33 and R34.

The control driver 800 can receive the external power supply voltage VDD when the control signal 'ctrl' is activated, and can drive the external power supply voltage VDD in response to the detection signal 'det'. Accordingly, the control driver 800 can supply the driven voltage to the output terminal of the driver 620. For example, the control driver 800 can include second and third transistors P32 and P33. The second transistor P32 can have a gate terminal to which the control signal 'ctrl' can be supplied, and a source terminal to which the external power supply voltage VDD can be supplied. The third transistor P33 can have a gate terminal to which the detection signal 'det' can be supplied, a source terminal to which a drain of the second transistor P32 can be connected, and a drain terminal that can be used as an output terminal of the control driver 800.

An exemplary operation of the internal voltage generating circuit will be described in detail with reference to FIG. 5.

The internal voltage generating unit 600 can generate the detection signal 'det' by comparing the first reference voltage Vref1 with the first division voltage V_dv1, which is generated by dividing the internal voltage V_int, and then generates the internal voltage V_int. If the external power supply voltage VDD is reduced so that the second division voltage V_dv2 is lower than the second reference voltage Vref2, then the control signal 'ctrl' can be activated at a low level.

When the control signal 'ctrl' is activated, the control driver 800 can drive the external power supply voltage VDD based on the voltage level of the detection signal 'det', and then can supply the driven voltage to the output terminal thereof. As a result, the number of drivers, which can generate the internal voltage by driving the external power supply voltage VDD using the detection signal 'det', can be increased when the external power supply voltage VDD is reduced to a low level. Similarly, the number of drivers can be reduced when the external power supply voltage VDD increases to a high level. Accordingly, the internal voltage generating circuit can prevent the internal voltage from being reduced as the external power supply voltage VDD is reduced, and can provide sufficient amounts of current for the internal circuit even if the external power supply voltage VDD is reduced.

Figure 6:
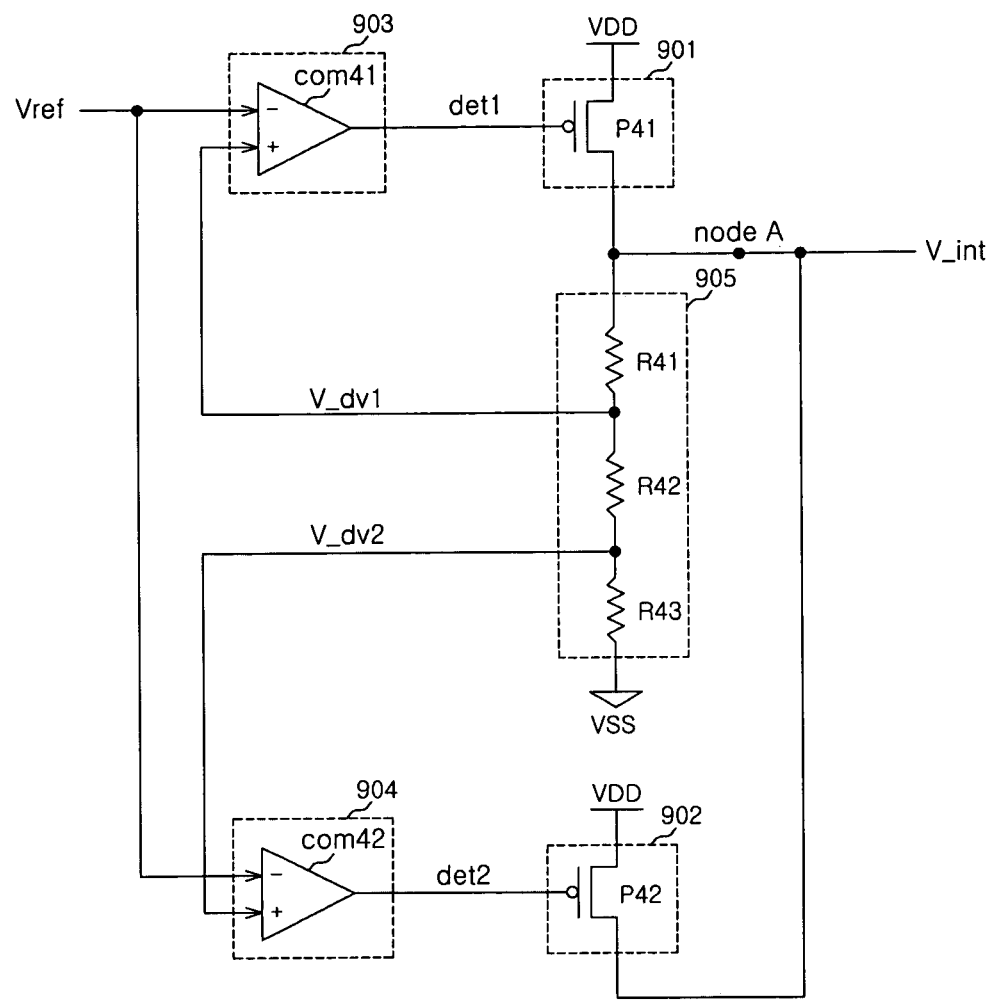
FIG. 6 is a schematic circuit diagram of another exemplary internal voltage generating circuit capable of being implemented in a semiconductor memory apparatus according to another embodiment.

FIG. 6 is a schematic circuit diagram of another exemplary internal voltage generating circuit capable of being implemented in a semiconductor memory apparatus according to another embodiment. In FIG. 6, an internal voltage generating circuit can be configured to include first and second drivers 901 and 902, first and second comparison units 903 and 904, and a voltage dividing unit 905.

The first driver 901 can perform the driving operation in response to a first detection signal 'det1'. For example, the first driver 901 can include a first transistor P41, wherein the first transistor P41 can have a gate terminal to which the first detection signal 'det1' can be supplied, a source terminal to which an external power supply voltage VDD can be supplied, and a drain terminal that can be connected to an output terminal of the first driver 901.

The second driver 902 can perform the driving operation in response to a second detection signal 'det2'. For example, the second driver 902 can include a second transistor P42, wherein the second transistor P42 can have a gate terminal to which the second detection signal 'det2' can be supplied, a source terminal to which the external power supply voltage VDD can be supplied, and a drain terminal that can be connected to the output terminal of the second driver 902. Accordingly, the first and second drivers 901 and 902 can be connected to a common node (node A), and the internal voltage can be output through the common node (node A).

The first comparison unit 903 can compare a reference voltage Vref with a first division voltage V_dv1, and then can generate the first detection signal 'det1'. For example, the first comparison unit 903 can generate the first detection signal 'det1', which can be activated at a low level, when the first division voltage V_dv1 is lower than the reference voltage Vref. Conversely, the first comparison unit 903 can generate the first detection signal 'det1', which can be inactivated at a high level, when the first division voltage V_dv1 is higher than the reference voltage Vref.

The first comparison unit 903 can include a first comparator com41. The first comparator com41 can receive the reference voltage Vref and the first division voltage V_dv1, and then can generate the first detection signal 'det1'.

The second comparison unit 904 can compare a reference voltage Vref with a second division voltage V_dv2, and then can generate the second detection signal 'det2'. For example, the second comparison unit 904 can generate the second detection signal 'det2', which can be activated at a low level, when the second division voltage V_dv2 is lower than the reference voltage Vref. Conversely, the second comparison unit 904 can generate the second detection signal 'det2', which can be inactivated at a high level, when the second division voltage V_dv2 is higher than the reference voltage Vref.

The second comparison unit 904 can include a second comparator com42. The second comparator com42 can receive the reference voltage Vref and the second division voltage V_dv2. and then can generate the second detection signal 'det2'.

The voltage dividing unit 905 can be connected between the common node (node A), to which output terminals of the first and second drivers 901 and 902 can be connected, and a ground voltage terminal VSS, and then can generate the first and second division voltages V_dv1 and V_dv2. Accordingly, the first division voltage V_dv1 can be higher than the second division voltage V_dv2.

The voltage dividing unit 905 can include first to third resistors R41 to R43 that can be connected in series to each other between the common node (node A) and the ground voltage terminal (VSS). Accordingly, the first division voltage V_dv1 can be output at a node at which the first resistor R41 can be connected to the second resistor R42, and the second division voltage V_dv2 can be output at a node at which the second resistor R42 can be connected to the third resistor R43.

An exemplary operation of the internal voltage generating circuit will be described in detail with reference to FIG. 6.

For example, the voltage dividing unit 905 can output the first division voltage V_dv1, which can have two-thirds (⅔) of the level of the internal voltage V_int, and can output the second division voltage V_dv2, which can have one-third (⅓) of the level of the internal voltage V_int. Accordingly, the first comparison unit 903 can generate the first detection signal 'det1' by detecting the level of the first division voltage V_dv1 and the reference voltage Vref.

The second comparison unit 904 can generate the second detection signal 'det2' by detecting the level of the second division voltage V_dv2 and the reference voltage Vref. For example, it can be presumed that the reference voltage Vref can have a voltage level of about 3V, and a target level of the internal voltage V_int can be about 6V. Accordingly, presuming that the internal voltage V_int can be about 6V, and the first to third resistors R41 to R43 in the voltage dividing unit 905 can have substantially the same resistance, the first division voltage V_dv1 can be about 4V and the second division voltage V_dv2 can be about 2V.

As a result, the first comparison unit 903 can receive the reference voltage Vref of about 3V and the first division voltage V_dv1 of about 4V, and then the first detection signal 'det1' can be inactivated at a high level. In addition, the second comparison unit 904 can receive the reference voltage Vref of about 3V and the second division voltage V_dv2 of about 2V, and then the second detection signal 'det2' can be activated at a low level. The first driver 901, which can receive the first detection signal 'det1', does not perform the driving operation and only the second driver 902, which can receive the second detection signal 'det2', can perform the driving operation. Accordingly, the internal voltage V_int can be generated by only the second driver 902 that can perform the driving operation.

If the internal voltage V_int goes below about 3V, then the first division voltage V_dv1 can be about 2V and the second division voltage V_dv2 can be about 1V. As a result, the first and second comparison units 903 and 904, which can receive the reference voltage Vref of about 3V, can generate the first and second voltages V_dv1 and V_dv2 that can be activated at a low level. Accordingly, all of the first and second drivers 901 and 902 can perform the driving operation to generate the internal voltage V_int.

If the internal voltage V_int goes above about 12V, then the first division voltage V_dv1 can be about 9V and the second division voltage V_dv2 can be about 6V. As a result, the first and second comparison units 903 and 904 can generate the first and second voltages V_dv1 and V_dv2 that can be inactivated at a high level. Accordingly, all of the first and second drivers 901 and 902 do not perform the driving operation.

The number of drivers to perform the driving operation can be controlled. Accordingly, when the internal voltage is reduced as the external power supply voltage is reduced, the amounts of current generated by the internal voltage can be swiftly controlled by the controlled number of drivers to perform the driving operation.

While certain embodiments have been described above, it will be understood that the embodiments described are by way of example only. Accordingly, the circuit and method described herein should not be limited based on the described embodiments. Rather, the circuits and methods described herein should only be limited in light of the claims that follow when taken in conjunction with the above description and accompanying drawings.

What is claimed is:

1. An internal voltage generating circuit of a semiconductor memory apparatus, comprising:
    a first voltage generating unit including
        a comparison unit that generates a first detection signal that is enabled in a low level by comparing a first reference voltage with a first division voltage, and
        a first PMOS transistor driver that drives an external power supply voltage in response to a voltage level of the first detection signal and outputs a first output voltage to a common node; and
    a second voltage generating unit including
        a comparison unit that generates a second detection signal that is enabled in the low level by comparing a second reference voltage with a second division voltage, and
        a second PMOS transistor driver that drives the external power supply voltage in response to a voltage level of the second detection signal and outputs a second output voltage to the common node.

2. The internal voltage generating circuit of claim 1, wherein the first voltage generating unit is configured to maintain the first output voltage in a substantially constant level by comparing the first reference voltage with the first output voltage.

3. The internal voltage generating circuit of claim 1, wherein the first voltage generating unit includes:
    a voltage dividing unit that generates the first division voltage by dividing the first output voltage.

4. The internal voltage generating circuit of claim 1, wherein the second voltage generating unit is configured to maintain the second output voltage in a substantially constant level by comparing the second reference voltage with the second output voltage.

5. The internal voltage generating circuit of claim 1, wherein the second voltage generating unit includes:
   a voltage dividing unit that generates the second division voltage by dividing the second output voltage.

* * * * *